(12) United States Patent
Yamada

(10) Patent No.: US 8,188,604 B2
(45) Date of Patent: May 29, 2012

(54) SEMICONDUCTOR DEVICE INCORPORATING PREVENTATIVE MEASURES TO REDUCE CRACKING IN EXPOSED ELECTRODE LAYER

(75) Inventor: Shigeru Yamada, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 379 days.

(21) Appl. No.: 12/395,861

(22) Filed: Mar. 2, 2009

(65) Prior Publication Data

US 2009/0230563 A1 Sep. 17, 2009

(30) Foreign Application Priority Data

Mar. 14, 2008 (JP) ................................. 2008-066257

(51) Int. Cl.
| | |
|---|---|
| H01L 23/48 | (2006.01) |
| H01L 23/52 | (2006.01) |
| H01L 29/40 | (2006.01) |
| H01L 29/417 | (2006.01) |
| H01L 29/74 | (2006.01) |
| H01L 31/111 | (2006.01) |
| H01L 31/00 | (2006.01) |
| H01L 23/04 | (2006.01) |
| H01L 23/053 | (2006.01) |
| H01L 23/12 | (2006.01) |

(52) U.S. Cl. ........ 257/774; 257/114; 257/448; 257/621; 257/698; 257/700; 257/E21.597; 257/E23.011; 257/E23.067

(58) Field of Classification Search .................. 257/114, 257/448, 698, 774, E21.597, E23.067, 621, 257/700, E23.011
See application file for complete search history.

(56) References Cited

U.S. PATENT DOCUMENTS

| | | | | |
|---|---|---|---|---|
| 5,767,578 | A * | 6/1998 | Chang et al. ................... | 257/717 |
| 6,262,579 | B1 * | 7/2001 | Chazan et al. ................. | 324/537 |
| 7,183,497 | B2 * | 2/2007 | Kojima et al. ................. | 174/262 |
| 7,365,436 | B2 * | 4/2008 | Yamano ......................... | 257/774 |
| 7,388,277 | B2 * | 6/2008 | Pogge et al. ................... | 257/621 |
| 7,528,420 | B2 * | 5/2009 | Weng et al. ..................... | 257/98 |
| 7,528,480 | B2 * | 5/2009 | Mihara .......................... | 257/700 |
| 7,800,002 | B2 * | 9/2010 | Chujo et al. ................... | 174/263 |
| 7,833,894 | B2 * | 11/2010 | Hiatt .............................. | 438/598 |
| 7,843,068 | B2 * | 11/2010 | Murayama et al. ........... | 257/773 |
| 7,858,429 | B2 * | 12/2010 | Akram et al. ................... | 438/69 |

(Continued)

FOREIGN PATENT DOCUMENTS

JP 2000277892 A * 10/2000

(Continued)

*Primary Examiner* — Ida M Soward

(74) *Attorney, Agent, or Firm* — Taft Stettinius & Hollister LLP

(57) ABSTRACT

A semiconductor device capable of preventing a crack from occurring in an electrode layer exposed through a through hole which is formed in a semiconductor substrate and a method of manufacturing the semiconductor device. In exemplary embodiments, a through via and an opening in a passivation film are disposed so that an opening diameter of the through via is larger than an opening diameter of the opening of the passivation film, and an opening edge of the through via is located outside an opening edge of the opening of the passivation film. In other embodiments, the through via and the opening of the passivation film are disposed so that the opening edge of the through via is disposed at a location which does not overlap with the opening edge (opening edge of a portion in contact with a pad electrode) of the opening of the passivation film.

13 Claims, 11 Drawing Sheets

U.S. PATENT DOCUMENTS

| | | | |
|---|---|---|---|
| 7,880,179 B2 * | 2/2011 | Bieck et al. | 257/82 |
| 7,994,432 B2 * | 8/2011 | Kariya et al. | 174/260 |
| 8,084,854 B2 * | 12/2011 | Pratt et al. | 257/698 |
| 2005/0126818 A1 * | 6/2005 | Kojima et al. | 174/255 |
| 2005/0258522 A1 * | 11/2005 | En et al. | 257/670 |
| 2006/0286789 A1 * | 12/2006 | Sunohara et al. | 438/598 |
| 2007/0045780 A1 * | 3/2007 | Akram et al. | 257/621 |
| 2007/0241415 A1 * | 10/2007 | Ko et al. | 257/415 |
| 2008/0142976 A1 * | 6/2008 | Kawano | 257/758 |
| 2009/0014826 A1 * | 1/2009 | Chien et al. | 257/433 |
| 2009/0140415 A1 * | 6/2009 | Furuta | 257/700 |
| 2009/0166785 A1 * | 7/2009 | Camacho et al. | 257/433 |
| 2009/0255716 A1 * | 10/2009 | Kariya et al. | 174/252 |

FOREIGN PATENT DOCUMENTS

JP  2006-128171  5/2006

* cited by examiner

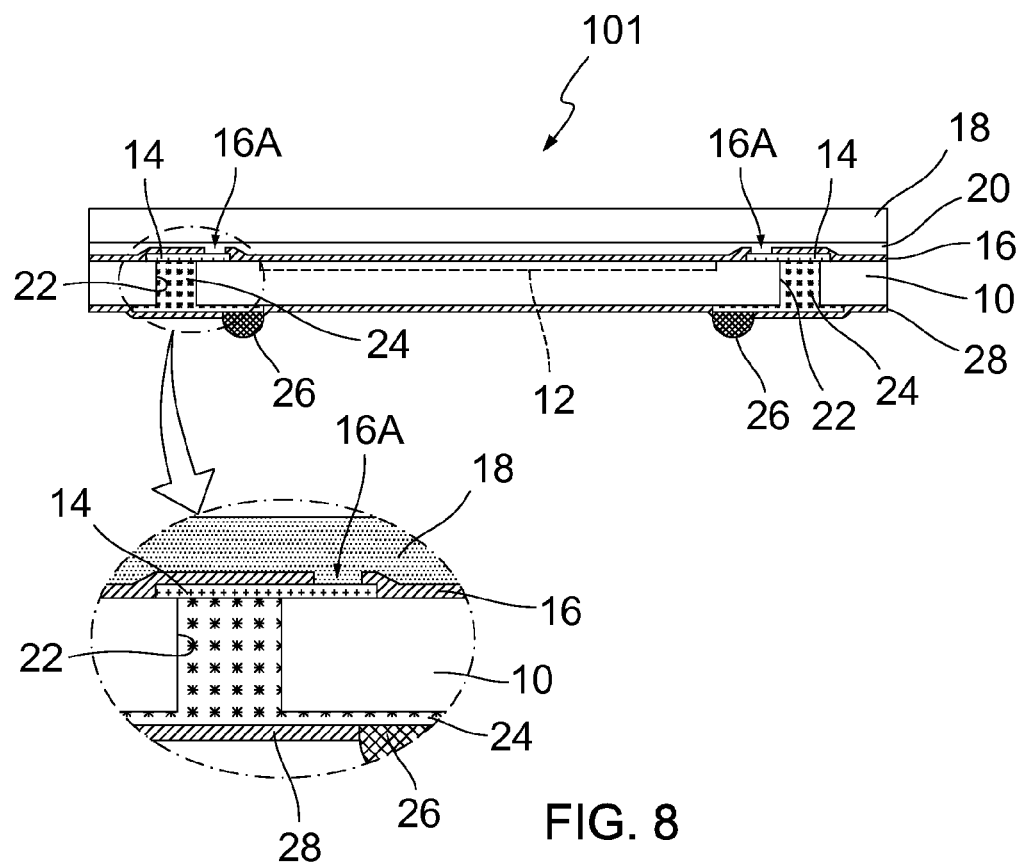
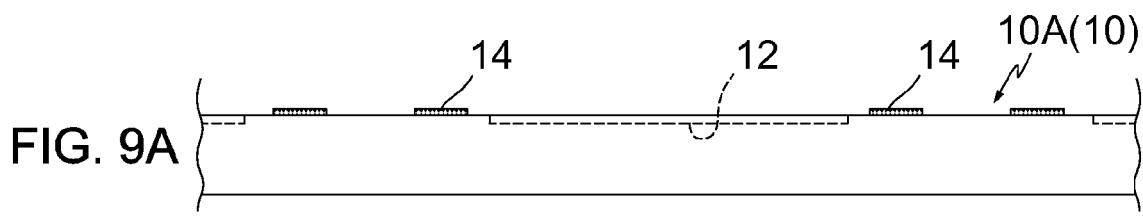
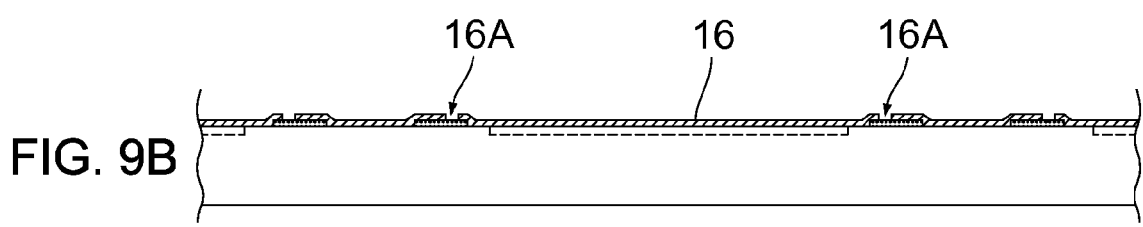
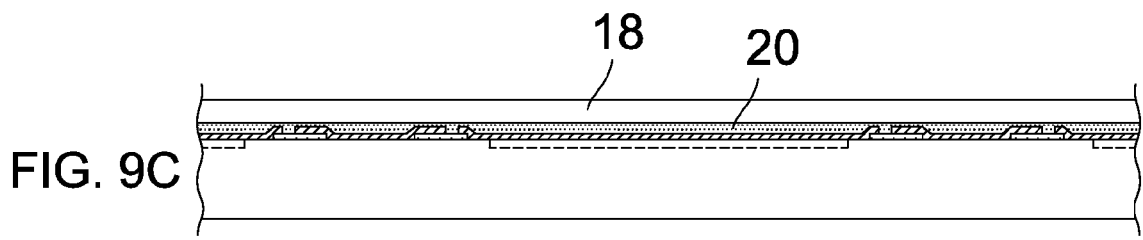
FIG. 8
FIG. 9A
FIG. 9B
FIG. 9C

SEMICONDUCTOR DEVICE INCORPORATING PREVENTATIVE MEASURES TO REDUCE CRACKING IN EXPOSED ELECTRODE LAYER

CROSS REFERENCE TO RELATED APPLICATION

This application claims the benefit of Japanese Patent Application No. 2008-066257, filed Mar. 14, 2008, which is incorporated by reference.

BACKGROUND

This disclosure relates to semiconductor devices, such as image sensor semiconductor device packages (such as complementary metal-oxide-semiconductor ("CMOS") sensors and charge-coupled device ("CCD") sensors), and to various sensor semiconductor device packages (such as illuminance sensors and ultraviolet ("UV") sensors), as well as semiconductor chip lamination packages (such as memory, and memory+logic), and to methods of manufacturing semiconductor devices.

A semiconductor device called a CSP (chip size package) includes through vias (through holes) formed from a rear surface of a semiconductor substrate, exposed pad electrodes formed on a surface of the semiconductor substrate, wirings formed from the exposed pad electrodes through the through vias, and external terminals provided on the rear surface of the semiconductor substrate. See, for example, Japanese Patent Application Laid-Open No. 2006-128171, which is incorporated by reference. In such a semiconductor device, the surface of the semiconductor substrate is normally covered with a passivation film (insulation layer). The passivation film is formed so as to cover the pad electrodes, and the passivation film is removed to form openings exposing a part of an electrode layer for carrying out electric property inspection or forming other electric connections.

SUMMARY

Exemplary embodiments include a semiconductor device capable of preventing a crack from occurring in an electrode layer exposed through a through hole which is formed in a semiconductor substrate and a method of manufacturing the semiconductor device. In exemplary embodiments, a through via and an opening in a passivation film are disposed so that an opening diameter of the through via is larger than an opening diameter of the opening of the passivation film, and an opening edge of the through via is located outside an opening edge of the opening of the passivation film. In other embodiments, the through via and the opening of the passivation film are disposed so that the opening edge of the through via is disposed at a location which does not overlap with the opening edge (opening edge of a portion in contact with a pad electrode) of the opening of the passivation film.

In an aspect, a semiconductor device may include a semiconductor substrate; an electrode layer disposed on a first main surface of the semiconductor substrate; an insulation layer disposed on the first main surface of the semiconductor substrate and including an insulation layer opening exposing a first part of the electrode layer; and a through hole extending from a second main surface of the semiconductor substrate in a thickness direction and exposing a second part of the electrode layer, the through hole having a diameter larger than a diameter of the insulation layer opening, the through hole having an edge located radially outside an opening edge of the first opening.

In a detailed embodiment, the semiconductor device may include wiring on the second main surface, and the wiring may be conductively coupled to the pad electrode via the through hole. In a further detailed embodiment, the semiconductor device may include a protective film at least partially covering the second main surface of the semiconductor substrate.

In a detailed embodiment, the semiconductor device may further include a protective substrate and an adhesive layer interposing the insulation film and the protective substrate.

In an aspect, a method of manufacturing a semiconductor device may include forming an electrode layer on a first main surface of a semiconductor substrate; forming an insulation layer on the first main surface of the semiconductor substrate so as to cover the electrode layer; forming an opening in the insulation layer exposing a first part of the electrode layer; and forming a through hole extending from a second main surface of the semiconductor substrate in a thickness direction and exposing a second part of the electrode layer, the hole having a diameter larger than an opening diameter of the opening, and the hole having an opening edge located radially outside an opening edge of the insulation layer opening.

In a detailed embodiment, the method may include forming wiring in the through hole and on the second main surface, the wiring being conductively connected to the electrode layer. In a further detailed embodiment, the method may include forming a protective film at least partially covering the wiring.

In an aspect, a semiconductor device may include a semiconductor substrate; an electrode layer which is disposed on a first main surface of the semiconductor substrate; an insulation layer which is disposed on the first main surface of the semiconductor substrate and includes an opening exposing a part of the electrode layer; and a through hole extending from a second main surface of the semiconductor substrate in a thickness direction for exposing a part of the electrode layer and which is disposed at a location in which its circumference is radially outside of the insulation layer opening.

In a detailed embodiment, a semiconductor device may include wiring on the second main surface, and the wiring may be conductively coupled to the pad electrode via the through hole. In a further detailed embodiment, the semiconductor device may include a protective film at least partially covering the second main surface of the semiconductor substrate.

In a detailed embodiment, the semiconductor device may include a protective substrate and an adhesive layer interposing the insulation film and the protective substrate.

In an aspect, a method of manufacturing a semiconductor device may include forming an electrode layer on a first main surface of the semiconductor substrate; forming an insulation layer on the first main surface of the semiconductor substrate so as to cover the electrode layer; forming an opening in the insulation layer for exposing a first part of the electrode layer; and forming a through hole which extending from a second main surface of the semiconductor substrate in a thickness direction and exposing a second part of the electrode layer, the through hole being disposed at a location in which its circumference is positioned radially outside of the insulation layer opening.

In a detailed embodiment, the method may include forming wiring in the through hole and on the second main surface, the wiring being conductively connected to the electrode layer. In a further detailed embodiment, the method may include forming a protective film at least partially covering the wiring.

In an aspect, a semiconductor device may include a semiconductor substrate; an electrode layer disposed on a first main surface of the semiconductor substrate; an insulation layer disposed on the first main surface of the semiconductor substrate and including an insulation layer opening exposing a first part of the electrode layer; and a through hole extending from a second main surface of the semiconductor substrate in a thickness direction and exposing a second part of the electrode layer, the through hole having a circumference and a diameter larger than a diameter of the insulation layer opening.

In a detailed embodiment, the entire insulation layer opening may be positioned within the through hole circumference. In a detailed embodiment, the insulation layer opening may overlap the through hole circumference. In a detailed embodiment, the entire insulation layer opening may be positioned radially outside of the through hole circumference.

BRIEF DESCRIPTION OF THE DRAWINGS

The detailed description refers to the Figures, in which:

FIG. 8 is a schematic sectional view taken along a line B-B shown in FIG. 7;

FIGS. 9A-9G are diagrams illustrating exemplary processes for manufacturing the semiconductor device according to the second exemplary embodiment;

DETAILED DESCRIPTION

The present disclosure contemplates that known semiconductor device may be weak against stress due to a thin thickness (for example, 1 to 3 μm) of the pad electrode, and the pad electrodes may not be usable if a crack occurs in the pad electrode in the vicinity of the through via upon applying a force (such as physical impact) against the semiconductor device. Exemplary embodiments described herein include semiconductor devices capable of preventing cracks from occurring in the electrode layer exposed through the through via which is formed in the semiconductor substrate, and a method of manufacturing such semiconductor devices.

Figure 1:
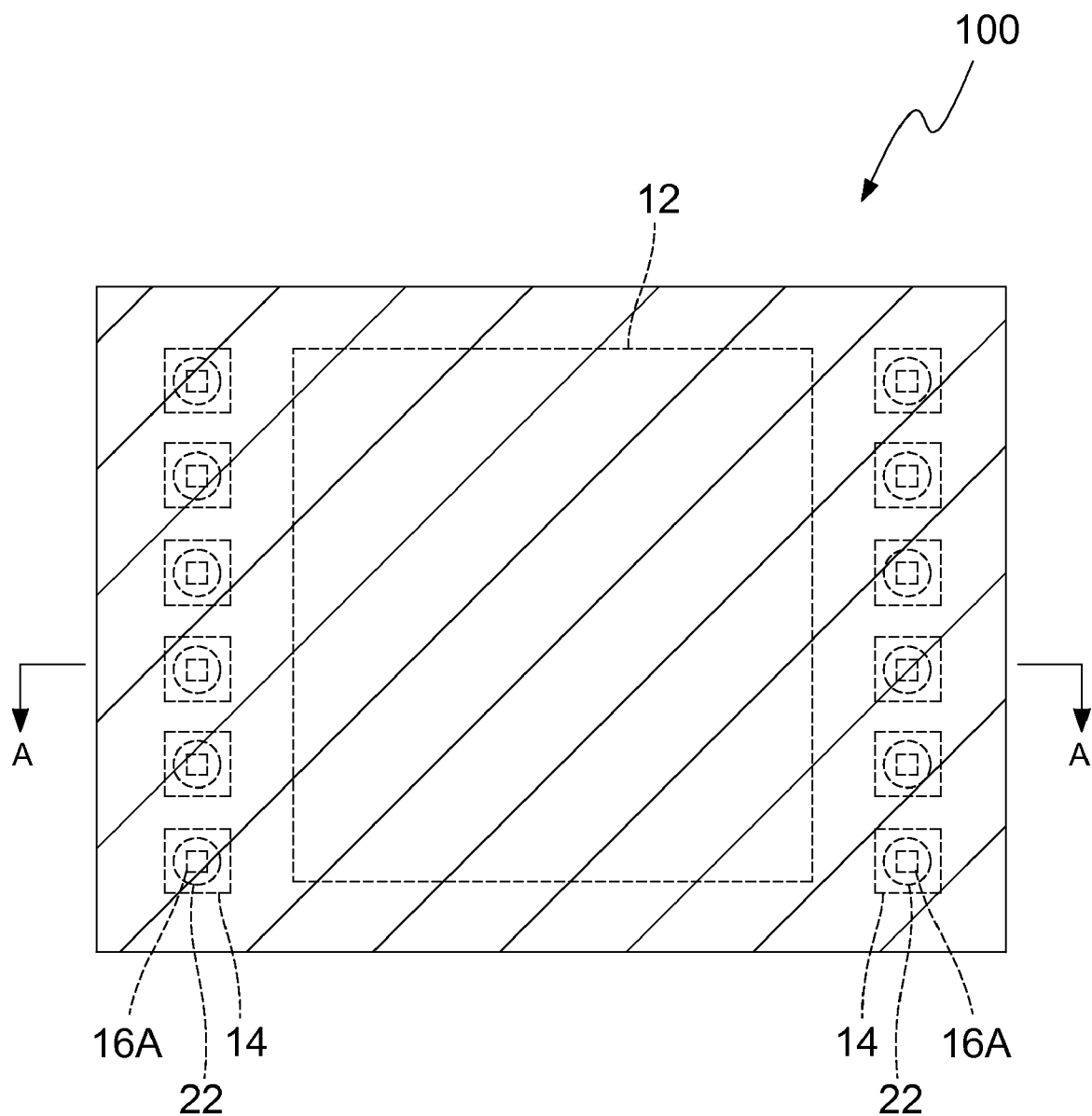
FIG. 1 is a schematic plan view illustrating a semiconductor device according to a first exemplary embodiment.
Figure 2:
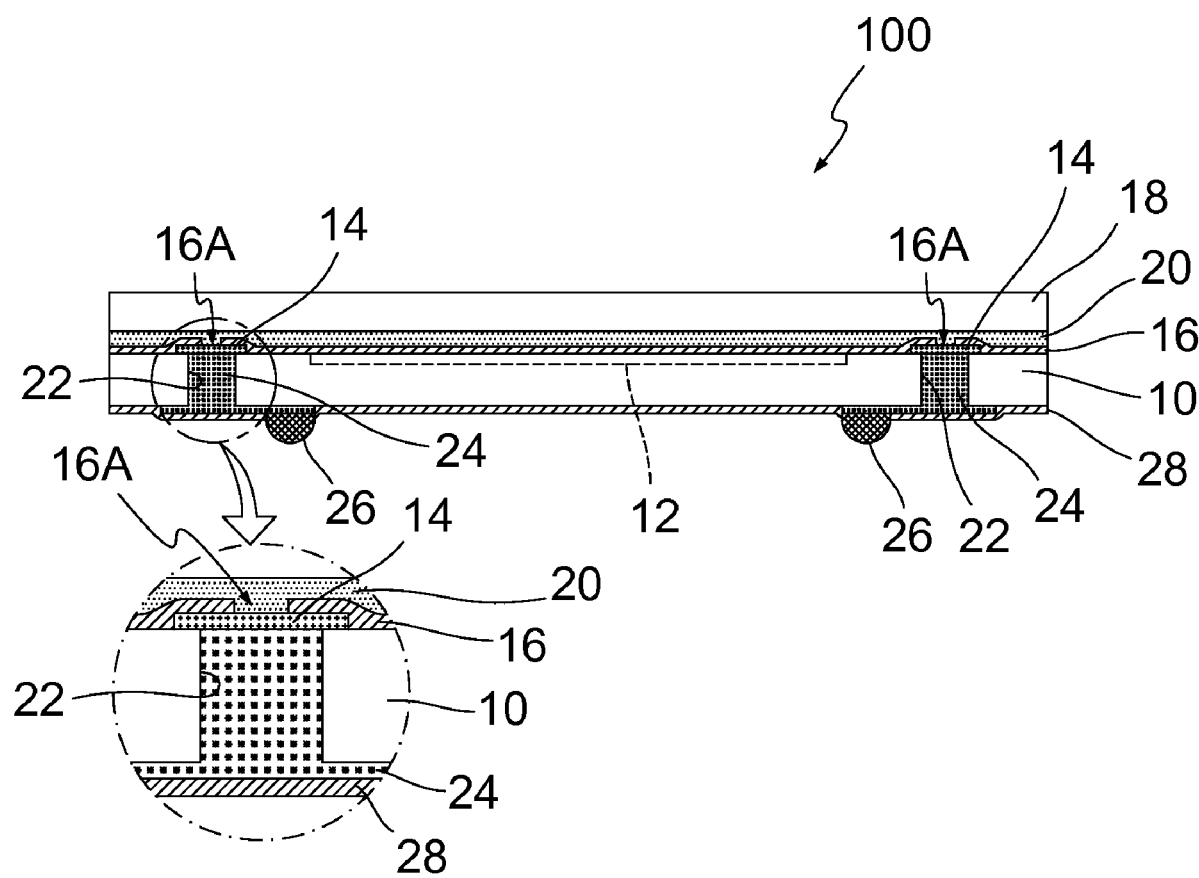
FIG. 2 is a schematic sectional view taken along a line A-A shown in FIG. 1.

FIG. 1 is a schematic plan view illustrating a semiconductor device according to a first exemplary embodiment. FIG. 2 is a schematic sectional view taken along a line A-A in FIG. 1. FIGS. 3A to 3G are diagrams illustrating exemplary processes of manufacturing the semiconductor device according to the first embodiment.

A semiconductor device 100 according to the first exemplary embodiment may be a CSP (chip size package) semiconductor device, for example.

According to the first exemplary embodiment, the semiconductor device 100 includes a silicon substrate 10 (semiconductor substrate). A semiconductor circuit 12 (semiconductor element) is disposed in the center of a first main surface of the silicon substrate 10. The semiconductor circuit 12 is a semiconductor circuit such as a sensor element circuit (image sensor (a CMOS sensor, a CCD sensor, etc.), other sensors (an illuminance sensor, a UV sensor, etc.), a memory circuit, or a logic circuit, for example.

Pad electrodes 14 (electrode layer) are disposed in ends of the first main surface of the silicon substrate 10. The pad electrodes 14 are formed of an aluminum electrode or the like and are electrically connected to the semiconductor circuit 12, for example. In this embodiment, five pad electrodes 14 are disposed along each of two opposite sides of the first main surface of the silicon substrate 10, for example. In this embodiment, the pad electrodes 14 are disposed directly on the first main surface of the silicon substrate 10. However, the pad electrodes 14 may be disposed on the first main surface of the silicon substrate 10 through an insulation film such as a silicon oxide film.

The semiconductor circuit 12 and the pad electrodes 14 are covered with a passivation film 16 (insulation layer) on the entire first main surface of the silicon substrate 10. The passivation film 16 is formed of a silicon nitride film, for example. In addition, each of openings 16A which exposes a part (center portion in this embodiment) of the pad electrode 14 is formed in the passivation film 16. Each of the openings 16A exposes the part of the pad electrode 14 for carrying out electric property inspection or forming another electric connection. In this embodiment, the opening 16A is formed for carrying out the electric property inspection.

A glass substrate 18 (protective substrate) is disposed on the first main surface of the silicon substrate 10 to protect the semiconductor device 100. The glass substrate 18 is adhered on the passivation film 16 through an adhesive film 20.

Through vias 22 (through holes) through a second main surface of the silicon substrate 10 in a thickness direction thereof are formed. Each of the through vias 22 is formed so as to expose a part (center portion in this embodiment) of the pad electrode 14 to the second main surface of the silicon substrate 10. In this embodiment, five through vias 22 are disposed along an arrangement location of the pad electrode 14, for example, each of two opposite sides of the second main surface of the silicon substrate 10.

In this exemplary embodiment, an opening diameter (an opening diameter of a portion in contact with the pad electrode 14) of the through via 22 is larger than an opening diameter (an opening diameter of a portion in contact with the pad electrode 14) of the opening 16A of the passivation film 16. In addition, an opening edge (an opening edge of a portion in contact with the pad electrode 14) of the through via 22 is disposed radially outside an opening edge (an opening edge of a portion in contact with the pad electrode 14) of the opening 16A of the passivation film 16. In other words, the opening diameter (the opening diameter of the portion in contact with the pad electrode 14) of the opening 16A of the passivation film 16 is smaller than the opening edge (the opening edge of the portion in contact with the pad electrode 14) of the through via 22. In addition, the opening edge (the opening edge of the portion in contact with the pad electrode 14) of the opening 16A of the passivation film 16 is disposed radially inside the opening edge (the opening edge of the portion in contact with the pad electrode 14) of the through via 22. It is not necessary that the opening 16A and the through via 22 are coaxial, however. Indeed, in this embodiment the opening 16A may be partially or completely overlapped by the through via 22 diameter.

In the present embodiment, the opening diameter refers to the maximum diameter. In some exemplary embodiments, a difference between the opening edge (the opening edge of the portion in contact with the pad electrode 14) of the through via 22 and the opening edge (the opening edge of the portion in contact with the pad electrode 14) of the opening 16A of the passivation film 16 is 10 μm or more, for example.

Wirings 24 (for example, copper wirings) which are conductively connected to the pad electrodes 14 filled in the through vias 22 to be exposed and drawn onto the second main surface are disposed on the second main surface of the silicon substrate 10. External terminals 26 (for example, solder balls) are disposed on parts of the wirings 24. The external terminals 26 may be disposed on the side wall of the through vias 22 and the second main surface of the silicon substrate 10 through an insulation film (for example, a silicon oxide film) and a barrier metal film (for example, a Ti film).

In this embodiment, the wirings 24 are filled in the through vias 22 to be conductively connected to the pad electrodes 14. However, the wirings 24 may extend to the second main surface of the silicon substrate 10 from the surfaces of the pad electrodes 14 exposed through the through vias 22 without filling the wirings 24 in the through vias 22.

On the entire second main surface of the silicon substrate 10, the surfaces of the wirings 24 other than connection portions connected to the externals 26 are covered with a protective film 28 (for example, a solder resist film).

Hereinafter, an exemplary method of manufacturing the semiconductor device 100 is described with reference to the configuration described above according to this exemplary embodiment.

Figure 3A:
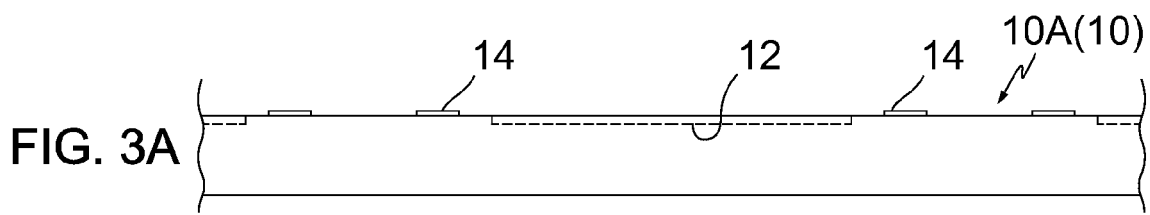
FIGS. 3A-3G are diagrams illustrating exemplary processes for manufacturing the semiconductor device according to the first exemplary embodiment.
Figure 4:
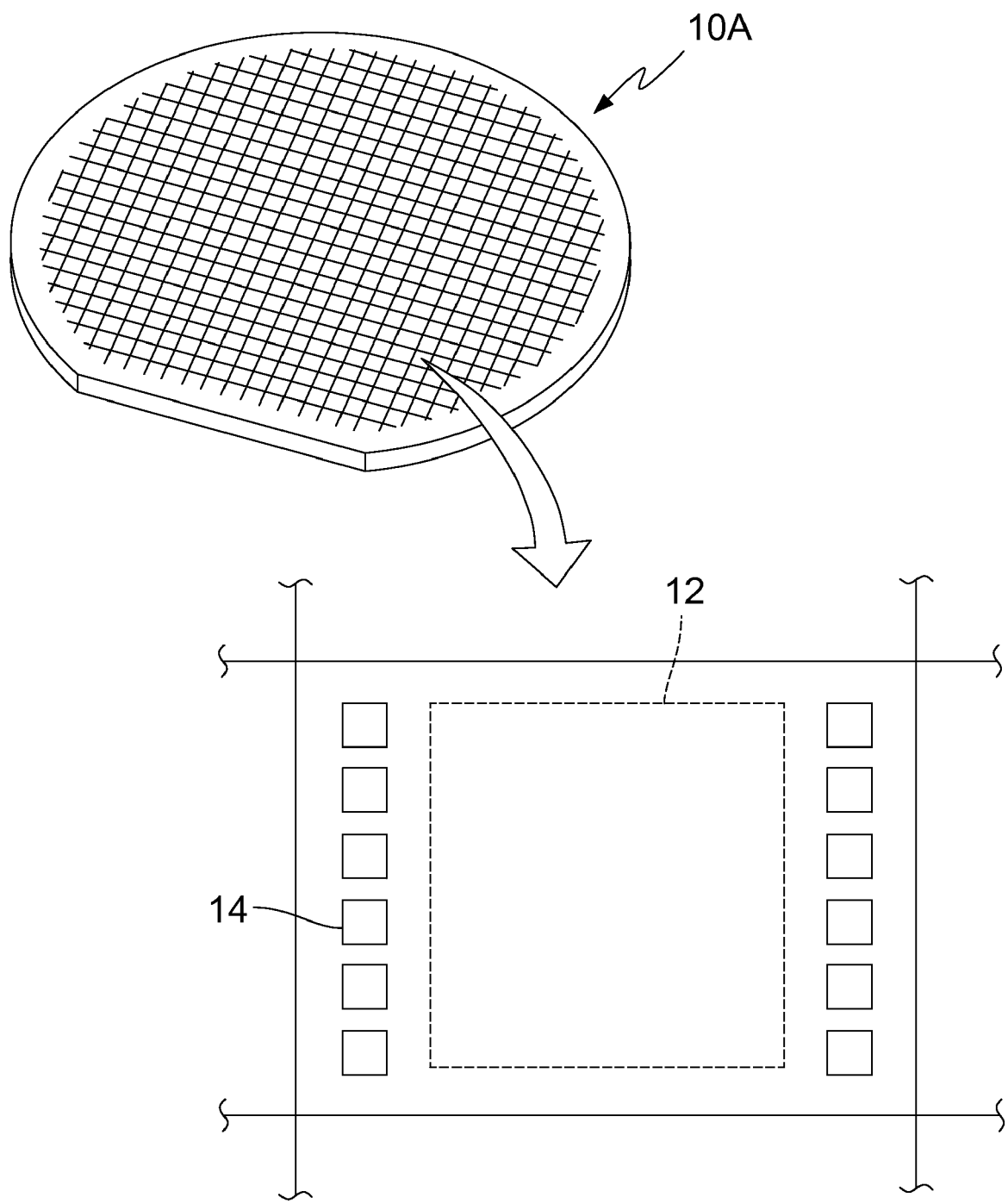
FIG. 4 is a schematic perspective view illustrating pad electrodes disposed in a silicon wafer (silicon substrate) during the exemplary processes of manufacturing the semiconductor device according to the first exemplary embodiment.

First, as illustrated in FIG. 3A, the first main surface of the silicon wafer 10A (the silicon substrate 10) is partitioned into a plurality of element areas, and the semiconductor circuit 12 is formed in every area by a semiconductor process. Subsequently, a mask is formed by coating, exposure, and etching of resist, and then the pad electrodes 14 made of aluminum are formed by sputter, plating, or the like (see FIG. 4).

Figure 3B:
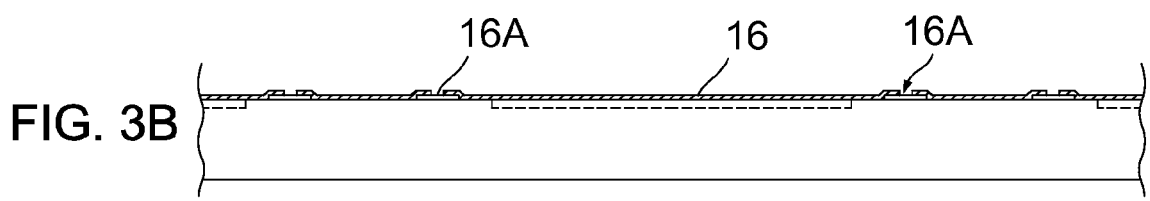
Figure 5:
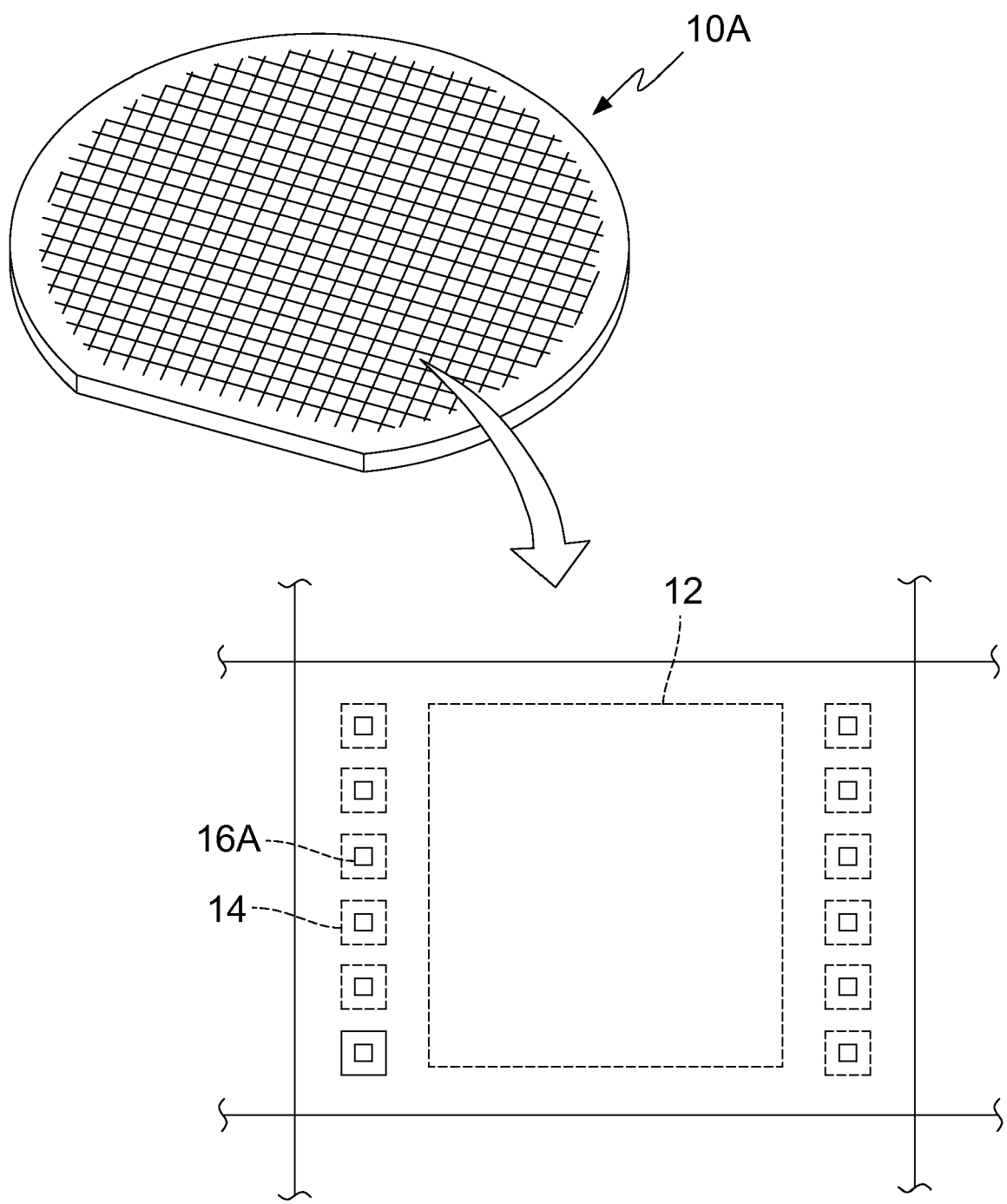
FIG. 5 is a schematic perspective view illustrating a passivation film including openings disposed in the silicon wafer (silicon substrate) during the exemplary processes of manufacturing the semiconductor device according to the first exemplary embodiment.

Subsequently, as illustrated in FIG. 3B, the passivation film 16 formed of a silicon nitride film is formed on the first main surface of the silicon wafer 10A (the silicon substrate 10) so as to cover the semiconductor circuit 12 and the pad electrodes 14, and the openings 16A exposing the parts of the pad electrodes 14 are formed in the passivation film 16 (see FIG. 5). In order to form the passivation film 16, a silicon nitride film is formed by, for example, plasma assisted chemical vapor deposition (P-CVD) with plasma by using $SiH_4$, $NH_3$, and $N_2$ as material gases. Subsequently, the openings 16A of the passivation film 16 are formed by forming a mask on the passivation film 16 by coating, exposing, and etching of resist and then etching the passivation film 16.

Here, the silicon wafer 10A including the passivation film 16 is called a sensor wafer or a memory wafer, for example. In many cases, the silicon wafer 10A is shipped or moved to another line since the silicon wafer in this state is subjected to a packaging process. Accordingly, before the shipment or the movement to another line or before a subsequent process (the packaging process) is performed, electric property inspection may be carried out using the pad electrodes 14 exposed through the openings 16A formed in the passivation film 16. Accordingly, the openings 16A exposing the pad electrodes 14 may be utilized in a manufacturing process.

Figure 3C:
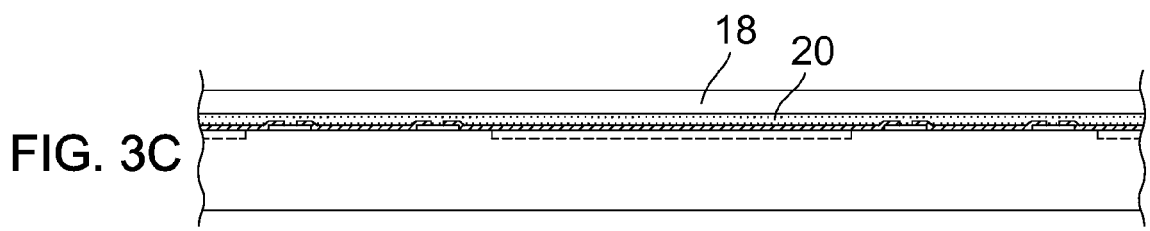

Next, as shown in FIG. 3C, the adhesive film 20 is coated onto the passivation film 16 disposed in the silicon wafer 10A by a spin coating method or the like, and then the glass substrate 18 is attached thereon. In exemplary embodiments, the process of attaching the glass substrate 18 may be performed at any time before the dicing process described below is performed after the formation of the passivation film 16.

Figure 3D:
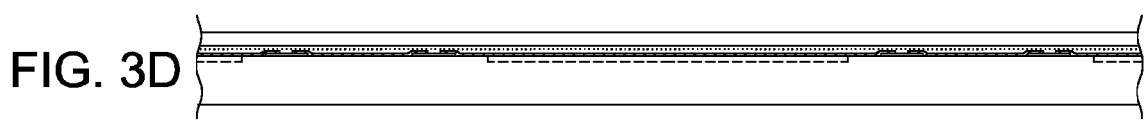

Subsequently, as illustrated in FIG. 3D, the second main surface of the silicon wafer 10A (the silicon substrate 10) is cut (a bite, a grind stone, a buff, etc.) to allow the silicon wafer 10A (the silicon substrate 10) to be thin up to about 100 μm, for example.

Figure 3E:
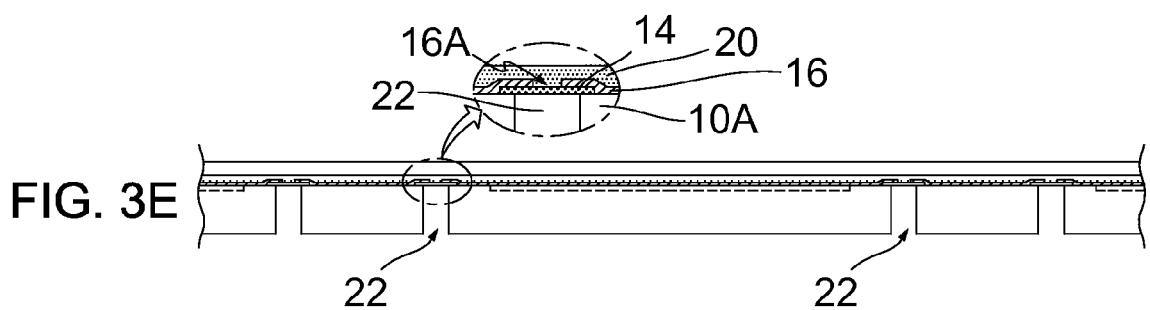
Figure 6:
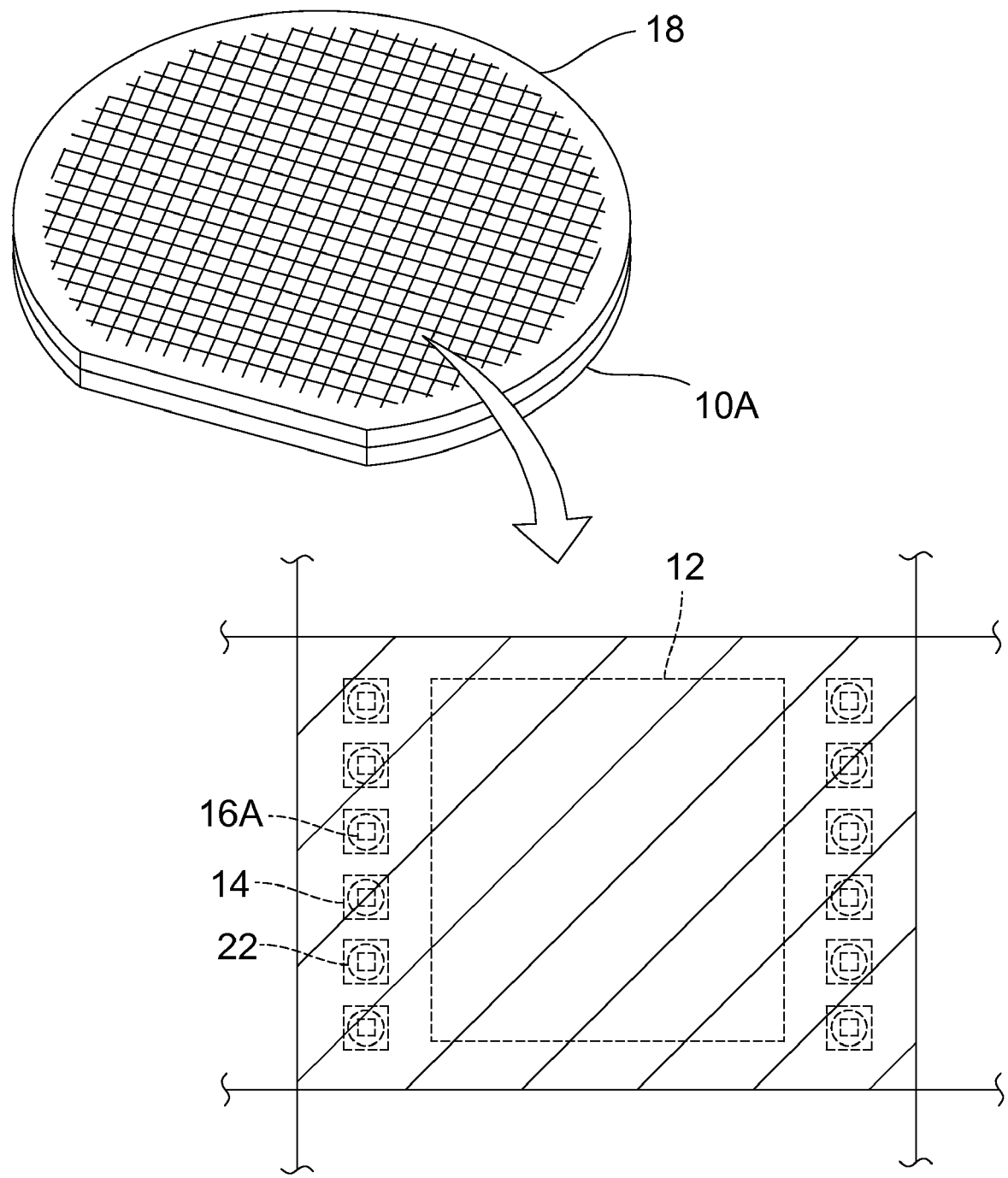
FIG. 6 is a schematic perspective view illustrating through vias disposed in the silicon wafer (silicon substrate) during the exemplary processes of manufacturing the semiconductor device according to the first exemplary embodiment.

Subsequently, as illustrated in FIG. 3E, the second main surface of the silicon wafer 10A (the silicon substrate 10) is cut by a dry etching process, a wet etching process, and a laser process until the pad electrodes 14 are exposed, and then the through vias 22 perforated in the thickness direction of the silicon wafer 10A (the silicon substrate 10) are formed (see FIG. 6). The pad electrodes 14 are exposed through the through vias 22.

Figure 3F:
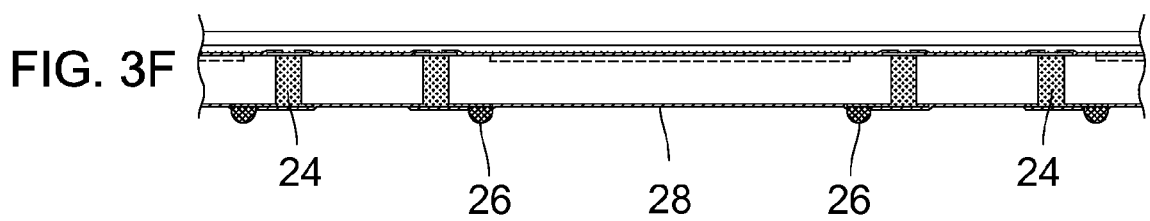

Subsequently, as illustrated in FIG. 3F, a mask is formed by coating, exposure, and etching by resist, and then the wirings 24 formed of a copper wiring by sputter, plating, or the like are filled in the through vias 22 and also drawn onto the second main surface of the silicon wafer 10A (the silicon substrate 10). Subsequently, the protective film 28 (such as a solder resist film) is formed by a spin coating method or the like, the openings 16A exposing the parts of the wirings 24 are formed, the external terminals 26 such a solder ball are formed on the wirings 24 exposed in the openings 16A.

Figure 3G:
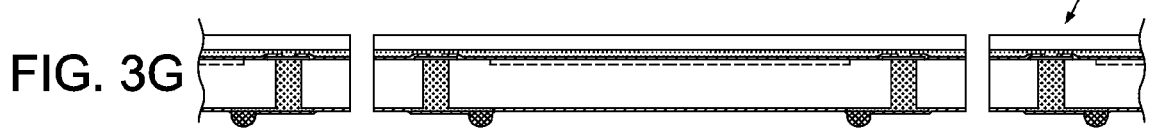

Subsequently, as illustrated in FIG. 3G, the dicing process is performed to dice the silicon wafer 10A into pieces, and obtain each CSP (Chip Size Package) semiconductor device 100.

In this embodiment, in the semiconductor device 100 described above, the opening diameter (the opening diameter of the portion in contact with the pad electrode 14) of the through via 22 is larger than the opening diameter (the opening diameter of the portion in contact with the pad electrode 14) of the opening 16A of the passivation film 16. In addition, the opening edge (the opening edge of a portion in contact with the pad electrode 14) of the through via 22 is disposed outside the opening edge (the opening edge of a portion in contact with the pad electrode 14) of the opening 16A of the passivation film 16.

With such a configuration, in the pad electrode 14, the inside vicinity of the opening edge of the through via 22 is held or supported by the passivation film 16 and is exposed through the through via 22. Therefore, it is possible to prevent a crack in the pad electrode 14 from occurring due to an impact during the manufacturing process, for example.

Figure 7:
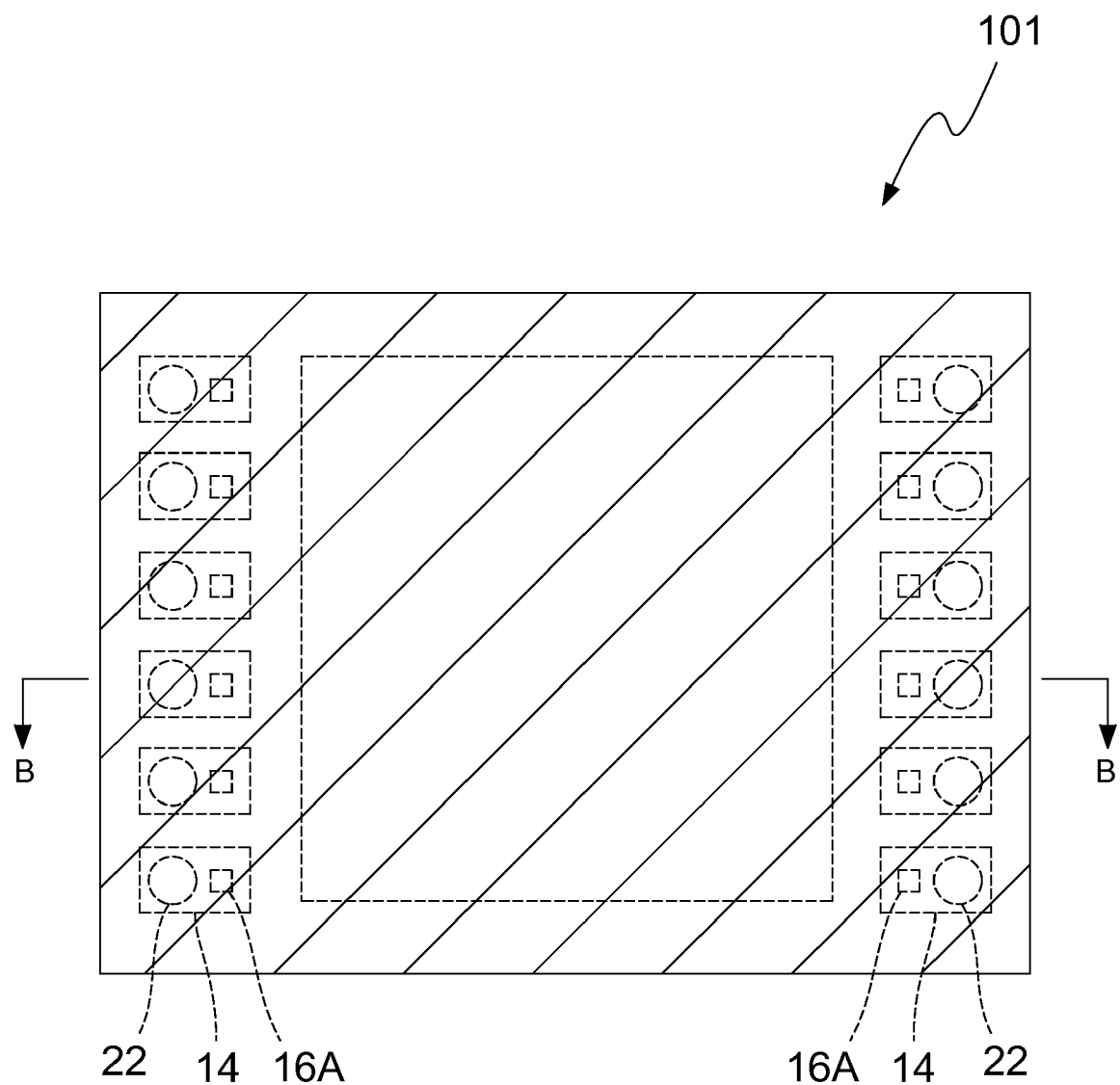
FIG. 7 is a schematic plan view illustrating a semiconductor device according to a second exemplary embodiment.

FIG. 7 is a schematic plan view illustrating the semiconductor device according to a second exemplary embodiment. FIG. 8 is a sectional view taken along a line B-B shown in FIG. 7. FIGS. 9A to 9G are diagrams illustrating processes of manufacturing the semiconductor device according to the second embodiment.

In a semiconductor device 101 according to the second embodiment, an opening edge (an opening edge of a portion in contact with a pad electrode 14) of a through via 22 is disposed at a location which does not overlap with an opening edge (an opening edge of a portion in contact with the pad electrode 14) of an opening 16A of a passivation film 16. In other words, the entire opening 16A of the passivation film 16 is disposed radially outside of the entire opening (the opening of the portion in contact with the pad electrode 14) of the through via 22.

Specifically, for example, the through via 22 is eccentrically disposed so that one end of the pad electrode 14 is exposed. On the other hand, the opening 16A of the passivation film 16 is eccentrically disposed so that the other end of the pad electrode 14 is exposed. That is, the opening edge of the through via 22 does not overlap with the opening edge of the opening 16A of the passivation film 16, when projected in a thickness direction of the pad electrode 14 on one plane. In addition, in some embodiments, a distance (the minimum distance when the both are projected in the thickness direction of the pad electrode 14 on one plane) between the opening edge of the through via 22 and the opening edge of the opening 16A of the passivation film 16 is 10 μm or more, for example, when projected in the thickness direction of the pad electrode 14 on one plane.

In general, the other components of the second exemplary embodiment are configured the same as the first embodiment.

Hereinafter, an exemplary method of manufacturing the semiconductor device 101 is described.

Figure 9D:
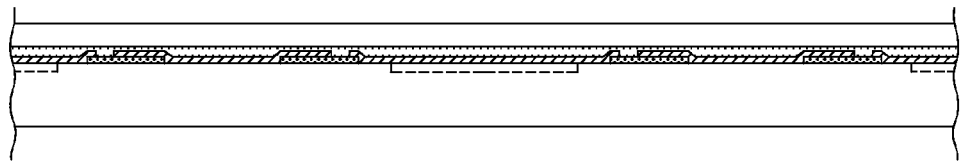
Figure 9E:
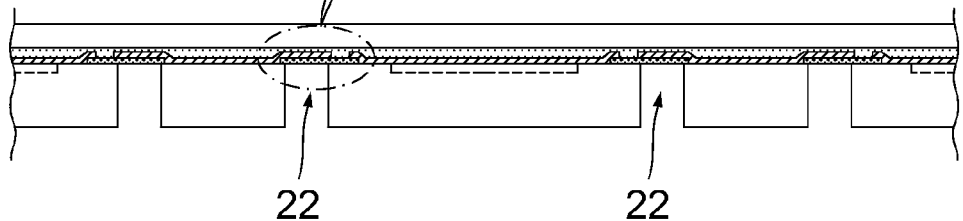
Figure 9F:
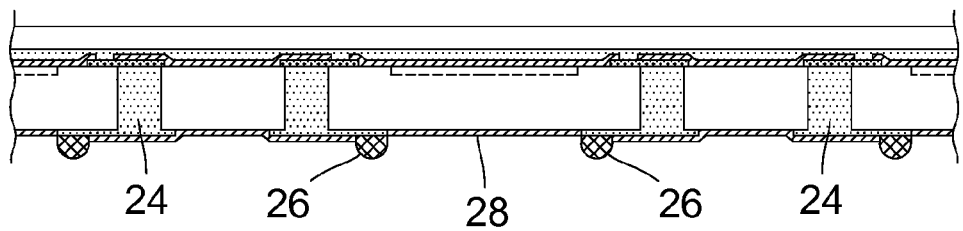
Figure 9G:
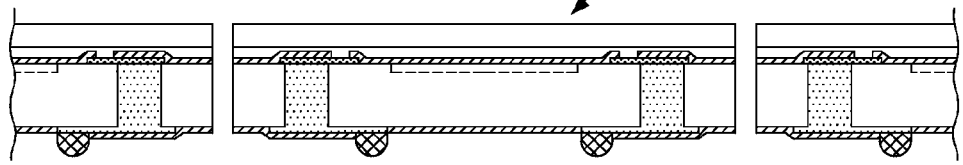
Figure 10:
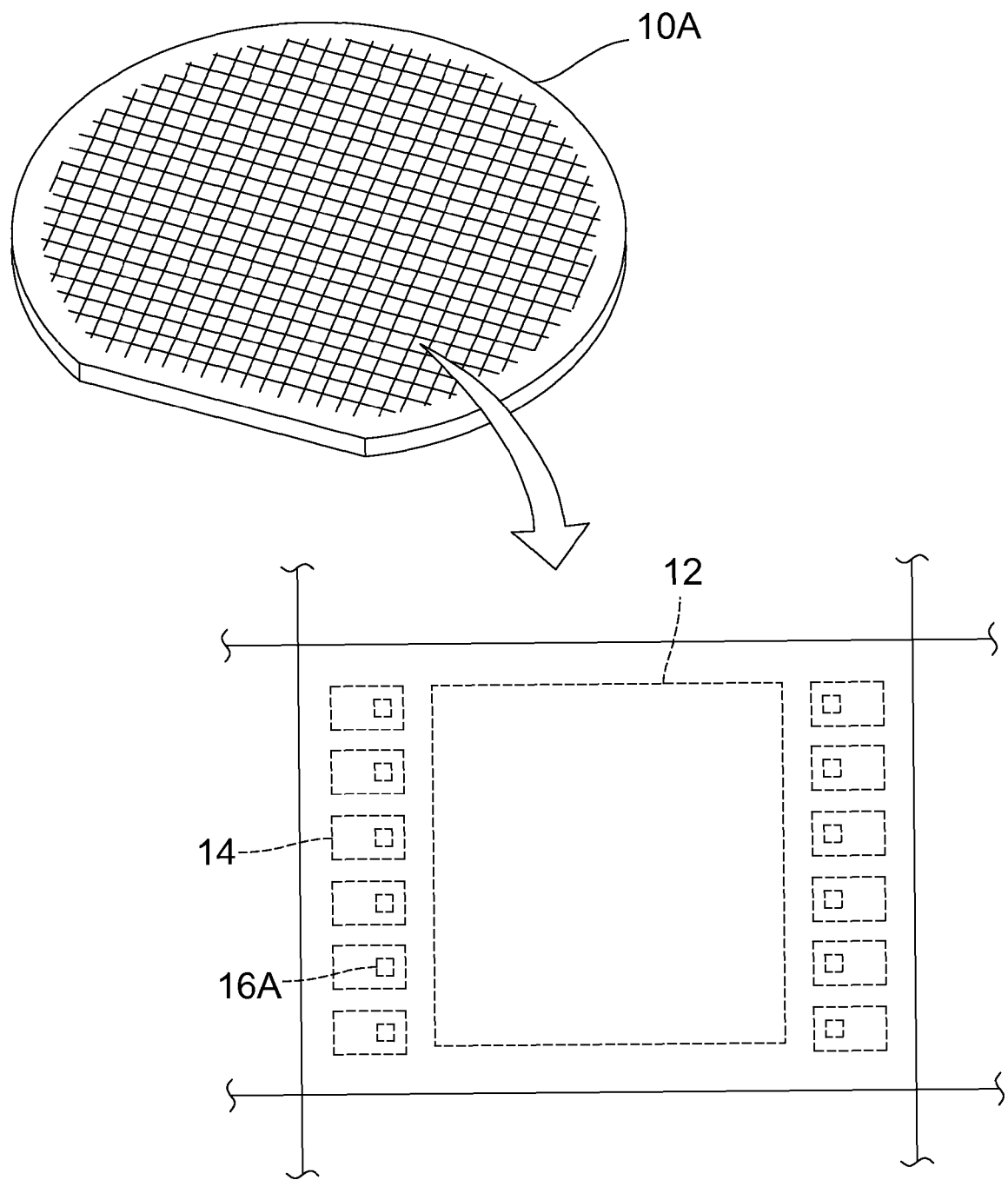
FIG. 10 is a schematic perspective view illustrating a passivation film including openings disposed in the silicon wafer (silicon substrate) during the exemplary processes of manufacturing the semiconductor device according to the second exemplary embodiment.
Figure 11:
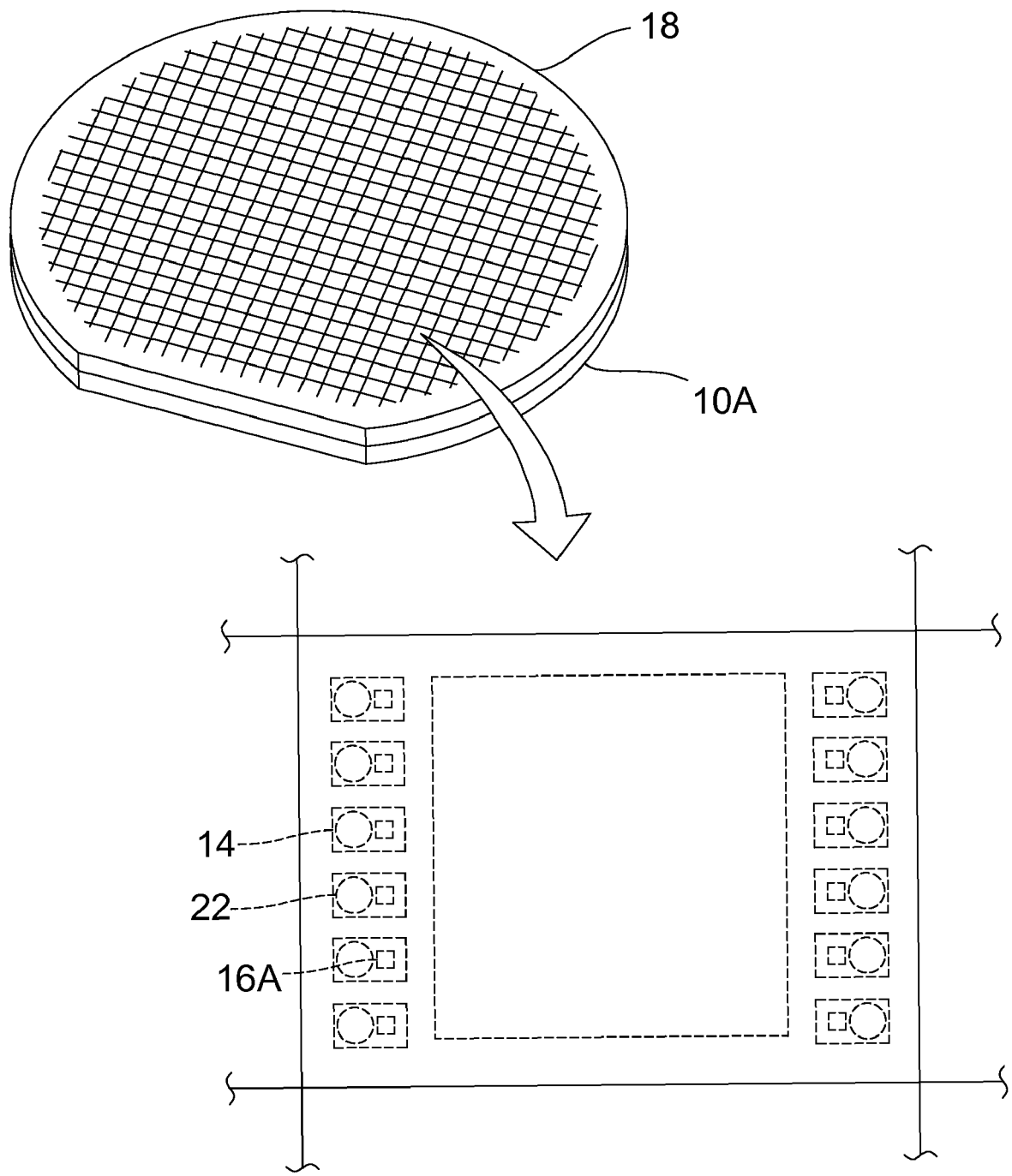
FIG. 11 is a schematic perspective view illustrating through vias disposed in the silicon wafer (silicon substrate) during an exemplary processes of manufacturing the semiconductor device according to the second exemplary embodiment.

First, as illustrated in FIG. 9B, the openings 16A of the passivation film 16 are eccentrically disposed so that the other ends of the pad electrodes 14 are exposed (see FIG. 10). Subsequently, as illustrated in FIG. 9E, each of the opening edges of the through vias 22 is eccentrically disposed so that the opening edge of the through via 22 does not overlap with the opening edge (the opening edge of the portion in contact with the pad electrode 14) of the opening 16A of the passivation film 16, and the one end of the pad electrode 14 is exposed (see FIG. 11).

Since the other manufacturing processes are generally the same as those of the first exemplary embodiment, a duplicative description is omitted.

In the semiconductor device 101 according to this embodiment, as described above, the opening edge (the opening edge of the portion in contact with the pad electrode 14) of the through via 22 is located so as not tot overlap with the opening edge (the opening edge of the portion in contact with the pad electrode 14) of the opening 16A of the passivation film 16.

With such a configuration, the entire inside of the opening edge of each through via 22 is held and supported by the passivation film 16 and the pad electrode 14 is exposed through the through via 22. Accordingly, in the pad electrode 14, a crack is prevented from occurring due to stress caused by impact during the manufacturing processes.

According to either the above-described embodiment, the semiconductor device is capable of preventing the crack from occurring owing to the shape and the location relation of the through via 22 and the opening 16A of the passivation film 16. As a result, the semiconductor device is simply manufactured without an additional operation (process) or a special process and without an increase in the number of manufacturing processes, thereby realizing low cost. The present disclosure contemplates that, in the known technique (for example, JP-A-2006-128171), the pad electrode exposed through the through via is held and supported by a wiring layer connected to the pad electrode in the area exposed through the through via. With such a configuration, the wiring layer has to be additionally formed, so that it is difficult to decrease the number of the manufacturing processes and realize low cost. However, according to either the above-described exemplary embodiments, the semiconductor device is capable of preventing the crack from occurring in the pad electrode at low cost without an increase in the number of manufacturing processes.

According to either the above-described exemplary embodiments, the semiconductor device may be utilized in image sensor semiconductor device packages such as a CMOS sensor and a CCD sensor, various sensor semiconductor device packages such as an illuminance sensor and a UV sensor, and semiconductor chip lamination (memory, memory+logic) packages and methods of manufacturing the semiconductor device, for example.

While exemplary embodiments have been set forth above for the purpose of disclosure, modifications of the disclosed embodiments as well as other embodiments thereof may occur to those skilled in the art. Accordingly, it is to be understood that the disclosure is not limited to the above precise embodiments and that changes may be made without departing from the scope. Likewise, it is to be understood that it is not necessary to meet any or all of the stated advantages or objects disclosed herein to fall within the scope of the disclosure, since inherent and/or unforeseen advantages of the may exist even though they may not have been explicitly discussed herein.

What is claimed is:

1. A semiconductor device comprising:
   a semiconductor substrate;
   an electrode layer disposed on a first main surface of the semiconductor substrate;
   an insulation layer disposed on the first main surface of the semiconductor substrate and including an insulation layer opening exposing a first part of the electrode layer;
   a wiring formed in a through hole of the semiconductor substrate and extending from a second main surface of the semiconductor substrate in a thickness direction and exposing a second part of the electrode layer, the through hole having a diameter larger than a diameter of the insulation layer opening, the through hole having an edge located radially outside an opening edge of the insulation layer opening; and,
   a protective substrate and an adhesive layer interposing the insulation film and the protective substrate.

2. The semiconductor device of claim 1, further comprising a semiconductor circuit in electrical communication with the electrode layer.

3. The semiconductor device of claim 1, further comprising wiring on the second main surface, the wiring being conductively coupled to the electrode layer via the through hole.

4. The semiconductor device of claim 3, further comprising a protective film at least partially covering the second main surface of the semiconductor substrate.

5. A semiconductor device comprising:
   a semiconductor substrate;
   an electrode layer which is disposed on a first main surface of the semiconductor substrate;
   an insulation layer which is disposed on the first main surface of the semiconductor substrate and includes an insulation layer opening exposing a part of the electrode layer;
   a wiring formed in a through hole of the semiconductor substrate and extending from a second main surface of the semiconductor substrate in a thickness direction for exposing a part of the electrode layer and which is disposed at a location in which its circumference is radially outside of the insulation layer opening; and a protective substrate and an adhesive layer interposing the insulation film and the protective substrate.

6. The semiconductor device of claim 5, further comprising a semiconductor circuit in electrical communication with the electrode layer.

7. The semiconductor device of claim 5, further comprising wiring on the second main surface, the wiring being conductively coupled to the electrode layer via the through hole.

8. The semiconductor device of claim 7, further comprising a protective film at least partially covering the second main surface of the semiconductor substrate.

9. A semiconductor device comprising:
a semiconductor substrate;
an electrode layer disposed on a first main surface of the semiconductor substrate;
an insulation layer disposed on the first main surface of the semiconductor substrate and including an insulation layer opening exposing a first part of the electrode layer;
a wiring formed in a through hole of the semiconductor substrate and extending from a second main surface of the semiconductor substrate in a thickness direction and exposing a second part of the electrode layer, the through hole having a circumference and a diameter larger than a circumference and a diameter of the insulation layer opening; and,
a protective substrate and an adhesive layer interposing the insulation film and protective substrate.

10. The semiconductor device of claim 9, wherein the entire insulation layer opening is positioned within the through hole circumference.

11. The semiconductor device of claim 9, wherein the insulation layer opening overlaps the through hole circumference.

12. The semiconductor device of claim 9, wherein the entire insulation layer opening is positioned radially outside of the through hole circumference.

13. The semiconductor device of claim 9, further comprising a semiconductor circuit in electrical communication with the electrode layer.

* * * * *